United States Patent [19]
Rose et al.

[11] Patent Number: 5,319,207
[45] Date of Patent: Jun. 7, 1994

[54] IMAGING SYSTEM FOR CHARGED PARTICLES

[75] Inventors: Harald Rose, Darmstadt; Ralf Degenhardt, Offenbach/M.; Dirk Preikszas, Aschaffenburg, all of Fed. Rep. of Germany

[73] Assignee: Carl-Zeiss-Stiftung, Heidenheim, Fed. Rep. of Germany

[21] Appl. No.: 940,844

[22] Filed: Sep. 4, 1992

[30] Foreign Application Priority Data

Sep. 4, 1991 [DE] Fed. Rep. of Germany ....... 4129403

[51] Int. Cl.$^5$ ...................... H01J 37/147; H01J 37/29
[52] U.S. Cl. ................................ 250/396 R; 250/311
[58] Field of Search ............................ 250/396 R, 311

[56] References Cited
U.S. PATENT DOCUMENTS 4,740,704  4/1988  Rose et al. ...................... 250/396 R

OTHER PUBLICATIONS

"Closed packed prism arrays for electron microscopy" by V. Kolarik et al, Optik, vol. 87, No. 1, 1991, pp. 1 to 12.

"Properties of a four-electrode adjustable electron mirror as an aberration corrector" by Zhifeng Shao et al, Review of Scientific Instruments, vol. 61, No. 4, 1990, pp. 1230 to 1235.

"Etude des aberrations du second ordre du microanalyseuur Ionique et de quelques autres systemes destines au filtrage d'images etendues" by M. Leleyter et al., Revue de Physique Applique, vol. 6, 1971, pp. 65 to 89.

"A theoretical Study of the hyperbolic electron mirror as a correcting element for spherical and chromatic aberration in electron optics" by G. F. Rempfer, Journal Applied Physics, vol. 67, No. 10, May 1990.

"Outline of a spherically corrected semiaplanatic medium-voltage transmission electron microscope" by H. Rose, Optik, vol. 85, No. 1 (1990).

*Primary Examiner*—Jack I. Berman
*Attorney, Agent, or Firm*—Walter Ottesen

[57] ABSTRACT

The invention relates to an imaging system for charged particles having a correction unit for correcting an objective lens. The correction unit essentially includes a beam deflector and a mirror which reflects the incoming particle beam. A first symmetry plane of the deflector is imaged in the mirror. The mirror images this first symmetry plane at an imaging scale of 1:1 in a second symmetry plane of the deflector. At the same time, the symmetry planes are either intermediate image planes or diffraction planes. With the high symmetry of the imaging system, the condition is achieved that the aberrations of the second order caused by a one-time pass-through through the deflector are cancelled after the second passthrough. The mirror can be so adjusted that its negative chromatic aberration compensates for the chromatic aberration of the objective lens and the other lenses. The spherical aberration can be compensated independently thereof with the aid of a hexapole which is centered in a diffraction plane.

25 Claims, 8 Drawing Sheets

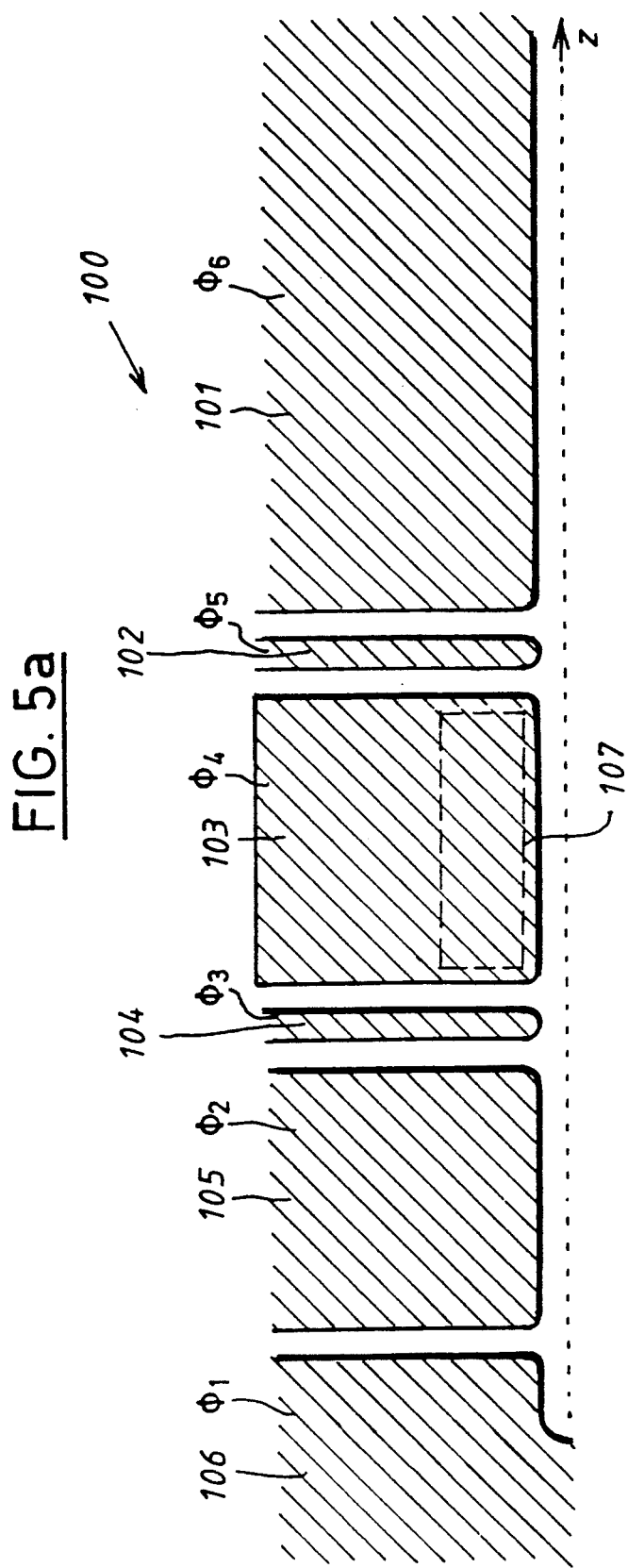

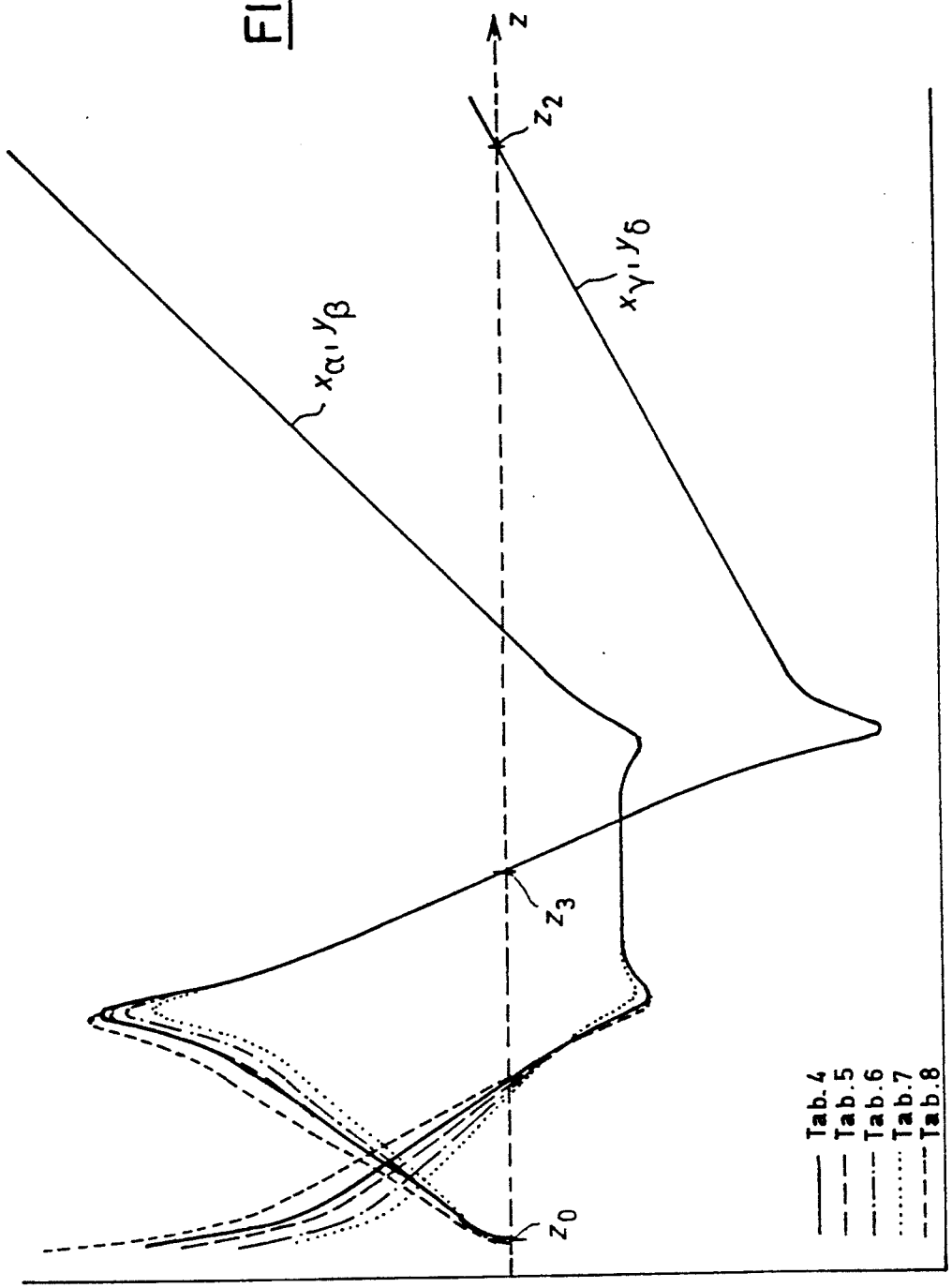

IMAGING SYSTEM FOR CHARGED PARTICLES

FIELD OF THE INVENTION

The invention relates to an imaging system for charged particles and especially an imaging system in a particle beam microscope.

BACKGROUND OF THE INVENTION

The generation of ion or electron optical imaging systems which have been corrected with respect to their chromatic aberration are complicated when compared to light optics. This situation is present because the electric and/or magnetic round lenses used for imaging always have positive chromatic aberrations. A correction of such imaging systems by means of a plurality of lenses arranged one behind the other is therefore not possible.

From the article of H. Rose entitled "Outline of a spherically corrected semiaplanatic medium-voltage transmission electron microscope" published in Optik, Volume 85, No. 1 (1990), page 19, it is known that spherical aberrations of an electron optic system can be corrected by two magnetic doublet systems and a magnetic hexapole element downstream of each doublet. It is also possible to obtain a simultaneous correction of spherical and chromatic aberrations by means of octupoles and combined electric-magnetic quadrupole elements; however, very high requirements are then imposed on the stability of the quadrupole fields as well as on the adjustment of the multipoles.

Furthermore, it is known to simultaneously correct chromatic and spherical aberrations by utilizing electrostatic mirrors since chromatic and spherical aberrations of electrostatic mirrors can be negative. An appropriate imaging system is shown, for example, in the article of G. F. Rempfer entitled "A theoretical study of the hyperbolic electron mirror as a correcting element for spherical and chromatic aberration in electron optics" published in the Journal of Applied Physics, Volume 67, No. 10, May 15, 1990, page 6027. For a mirror correction arrangement of this kind, a beam deflector is required which deflects the electron beam coming from the objective to the mirror and which deflects the electron beam reflected at the mirror into the viewing beam path. Magnetic beam deflectors, as a rule, themselves cause aberrations of the second order since they are not rotationally symmetric. To prevent these additional aberrations, the suggestion is made in the last-mentioned article that the deflection take place in intermediate image planes. Overall, a system is needed here which comprises three deflectors with interposed relay lens systems for each deflector so that the entire imaging system is very complex and costly.

A mirror correction arrangement is disclosed in the article of V. Kolarik et al entitled "Close packed prism arrays for electron microscopy" published in Optik, Volume 87, No. 1, (1991), page 1. In this mirror correction arrangement, a single 90° deflector having five sectors of different magnetic field strength is provided. The symmetry planes of the deflector are at the same time also intermediate image planes. The mirror itself is mounted in the image plane of a second cathode lens which is mounted rearward of a diffraction plane disposed outside of the deflector. The aberrations of the second order of the deflector here remain after a two-time passthrough of the electronic beam through the deflector.

SUMMARY OF THE INVENTION

It is an object of the invention to provide an imaging system of the kind described above which is improved in that the chromatic aberrations are corrected with a simple configuration.

According to a feature of the invention, the mirror is mounted so as to be conjugated to the two symmetry planes of the deflector and the two symmetry planes are imaged into each other with the imaging scale of 1:1.

In the imaging system of the invention, the mirror images the two symmetry planes one upon the other with an imaging scale of 1:1 and at the same time both symmetry planes are imaged in the mirror and thus the particle paths incoming to the mirror and leaving the mirror run symmetrically to the optical axis of the mirror and, in the deflector, the particle paths run symmetrically or antisymmetrically to the symmetry planes. Because of the foregoing, the aberrations of the second order and the dispersion vanish after the second passthrough through the deflector. Accordingly, there remain only the negative chromatic and spherical aberrations of the mirror. These can be so adjusted that the chromatic and spherical aberrations of other elements located in the beam path such as lenses or multipoles are compensated. The beam deflector then deflects the particle beam on the path to the mirror and on the path away from the mirror to the second plane each time at angles of the same magnitude.

A twist-free magnetic lens system can be mounted between the deflector and the mirror for imaging the symmetry planes in the mirror. Chromatic and spherical aberrations can be varied over a wide range by varying the lens excitation and the mirror voltage. However, an electrode arrangement operating simultaneously as an electrostatic mirror lens system having a magnetic hexapole element arranged in the vicinity of a diffraction plane is especially advantageous. Such an electrostatic mirror lens system is twist-free and the chromatic and spherical aberrations can then be adjusted independently of each other.

The symmetry planes of the deflector should intersect the optical axis of the electrostatic mirror lens combination or the optical axis of the magnetic lens system at half the deflection angle.

Preferably, the symmetry planes of the deflector are planes conjugated to the intermediate plane or the diffraction plane of an objective.

The imaging system of the invention can be used in reflection, transmission and scanning electron microscopes as well as in ion beam apparatus but somewhat limited. The energy range below 100 keV is especially advantageous for electron microscope applications.

The deflection angle of the beam deflector is intended to be 90° so that the optical axis forward of and rearward of the deflector can run vertically as is conventional for electron microscopes for reasons of stability.

Such a deflector having quadruple symmetry of the pole shoes in planes perpendicular to the magnetic field can simultaneously serve for separating the illuminating beam path from the viewing beam path in the presence of illumination.

Preferably, the beam deflector generates an outer magnetic field for splitting the particle paths with respect to direction and at least a second magnetic field. The fields are then so adjusted that the deflector, as a field lens, images the intermediate planes of the lenses disposed in the beam path stigmatically one into the other.

A deflector with the following is well suited for a scanning electron microscope: two magnetic fields of the same direction but of different magnitude and having symmetry planes conjugated to the diffraction plane of an objective. Deflectors of this kind comprising two segments are very simple. The dispersion is still present after one passthrough through the deflector. The combination errors caused by the interaction of the dispersion of the deflector with the errors of the mirror system vanish and are therefore not harmful.

Deflectors having two or three magnetic deflecting fields and possibly additional superposed electrostatic deflecting fields are preferred for correcting imaging aberrations in imaging systems wherein the correction is desired over a large image field. Such deflectors are very complex but on the other hand can be free of dispersion for every individual passthrough. With the help of one deflector which is already dispersion free for one passthrough and with the aid of an electrostatic mirror, chromatic and spherical aberrations of an objective can be corrected over a large image field, even for off-axis rays. A further magnification of the image field can be obtained by inserting additional lenses between deflector and mirror so that at least three lenses are effective between deflector and mirror.

In an especially preferred embodiment of the invention for a dispersion-free deflector, three separate magnetic fields are superposed on the outer magnetic field into which the electrons enter and leave twice with each passthrough. These magnetic fields are opposed to the outer field but are identical in magnitude and direction. The inner fields are each approximately twice as strong as the outer magnetic field.

The entry and exit surfaces of the outer magnetic field should define planes or surfaces disposed perpendicularly to the optical axis which are large compared to the cross-sectional surface of the particle beam because otherwise, peripheral quadrupoles occur which varyingly deflect electrons traveling back and forth. Furthermore, other disturbing influences of the peripheral field are avoided and the particle beams disposed in one plane and having the same entry angle trace paths in the outer field with the same radius of curvature.

BRIEF DESCRIPTION OF THE DRAWINGS

The invention will now be described with reference to the drawings wherein:

FIG. 2b illustrates the fundamental beam paths with reference to the optical axis of the beam deflector of FIG. 2a;

Figure 3A:
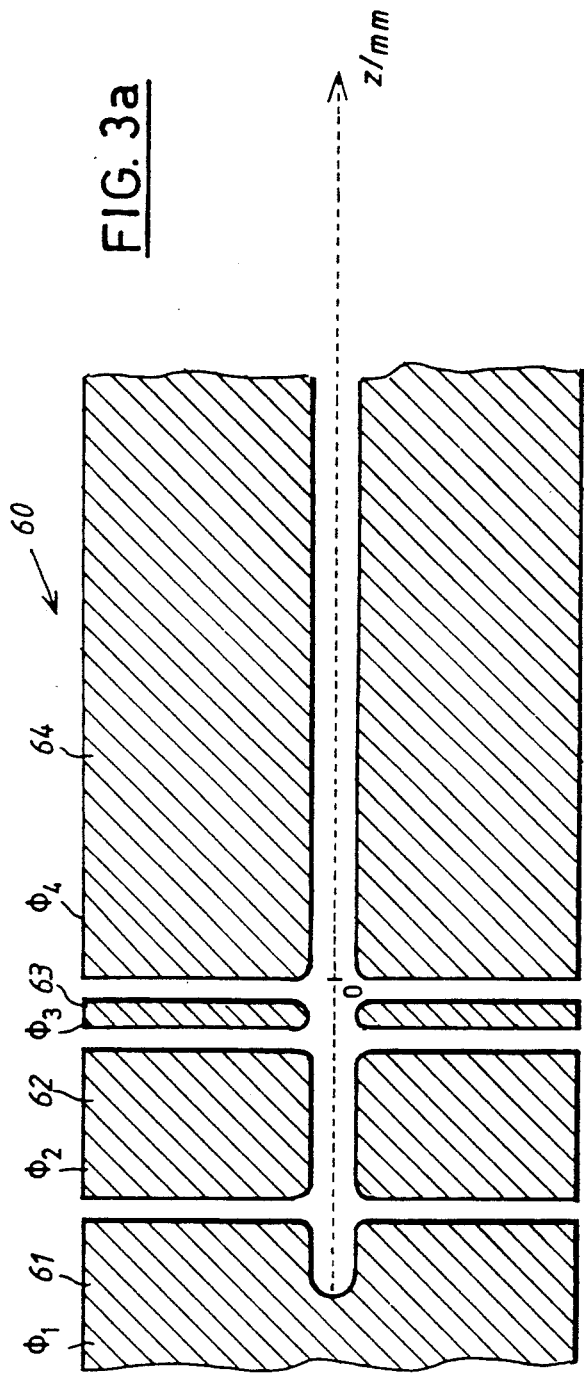
FIG. 3a is a section view taken through an electrostatic mirror lens combination having four electrodes.
Figure 3B:
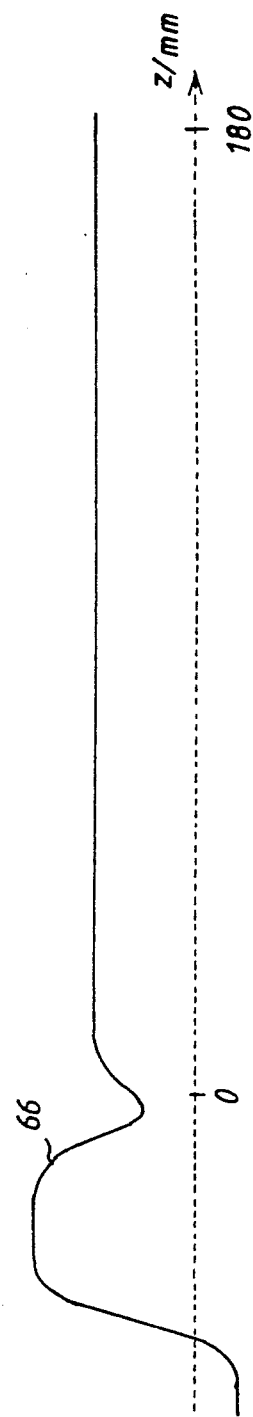
Figure 3C:
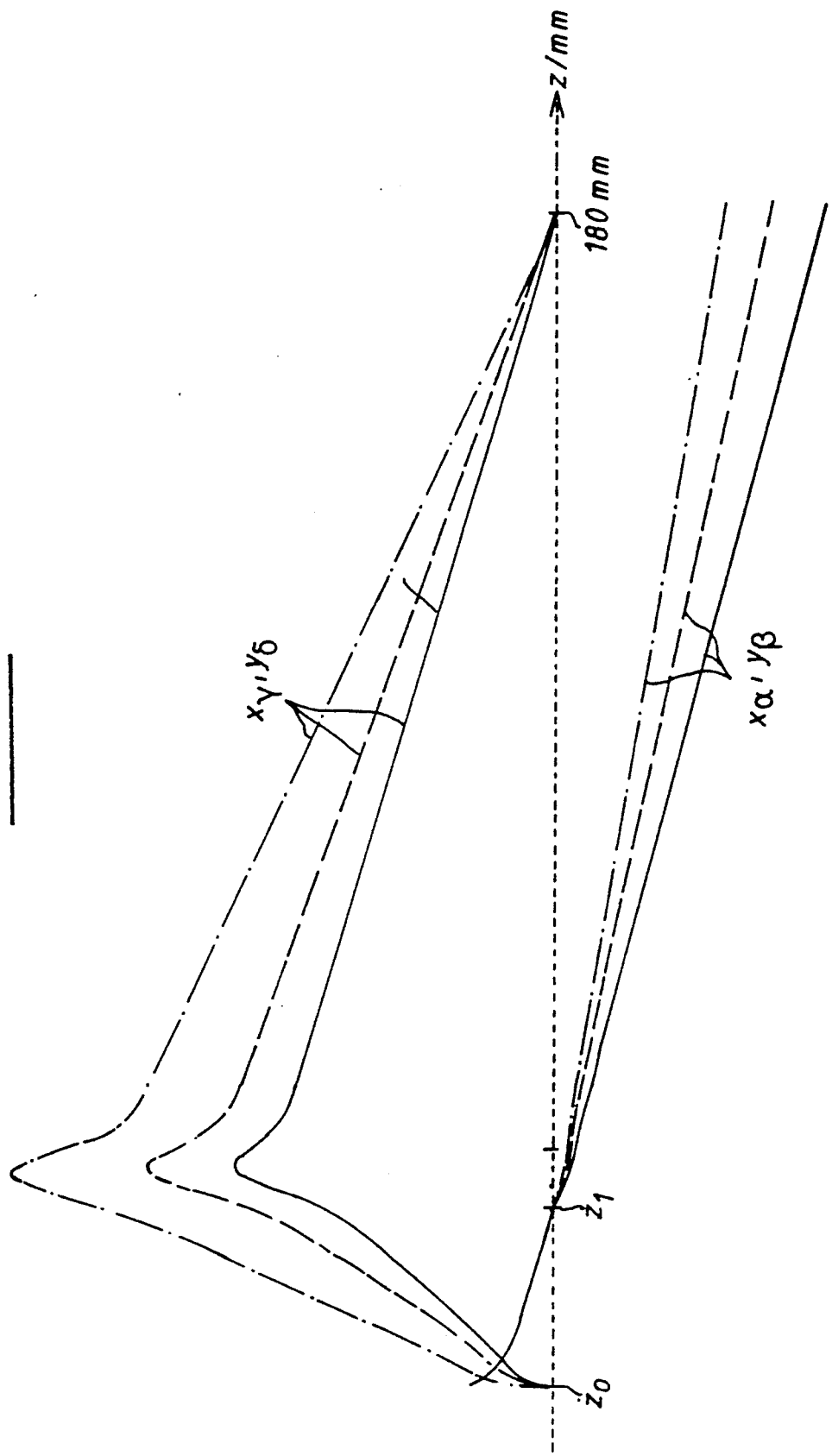
Figure 4:
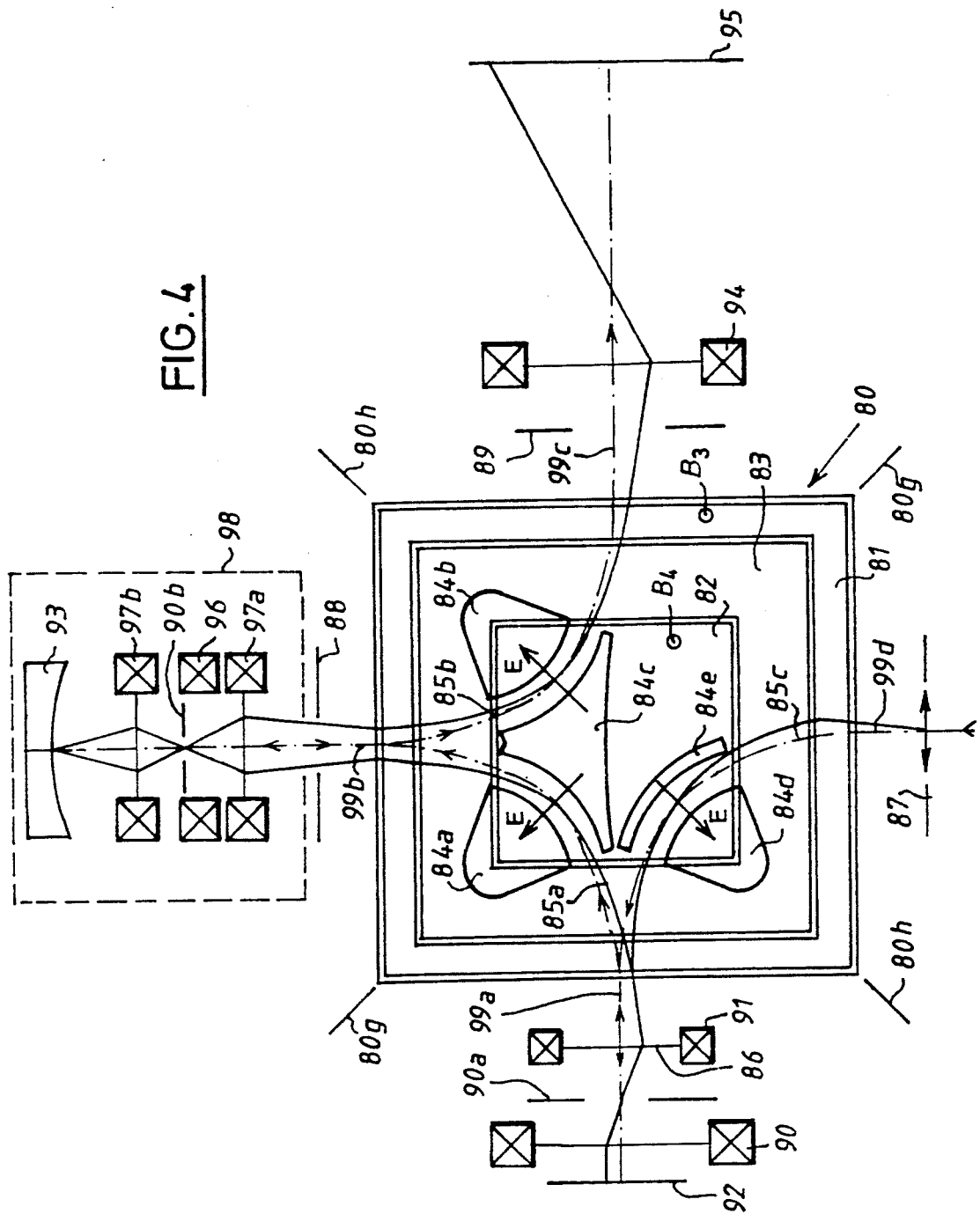
Figure 6:
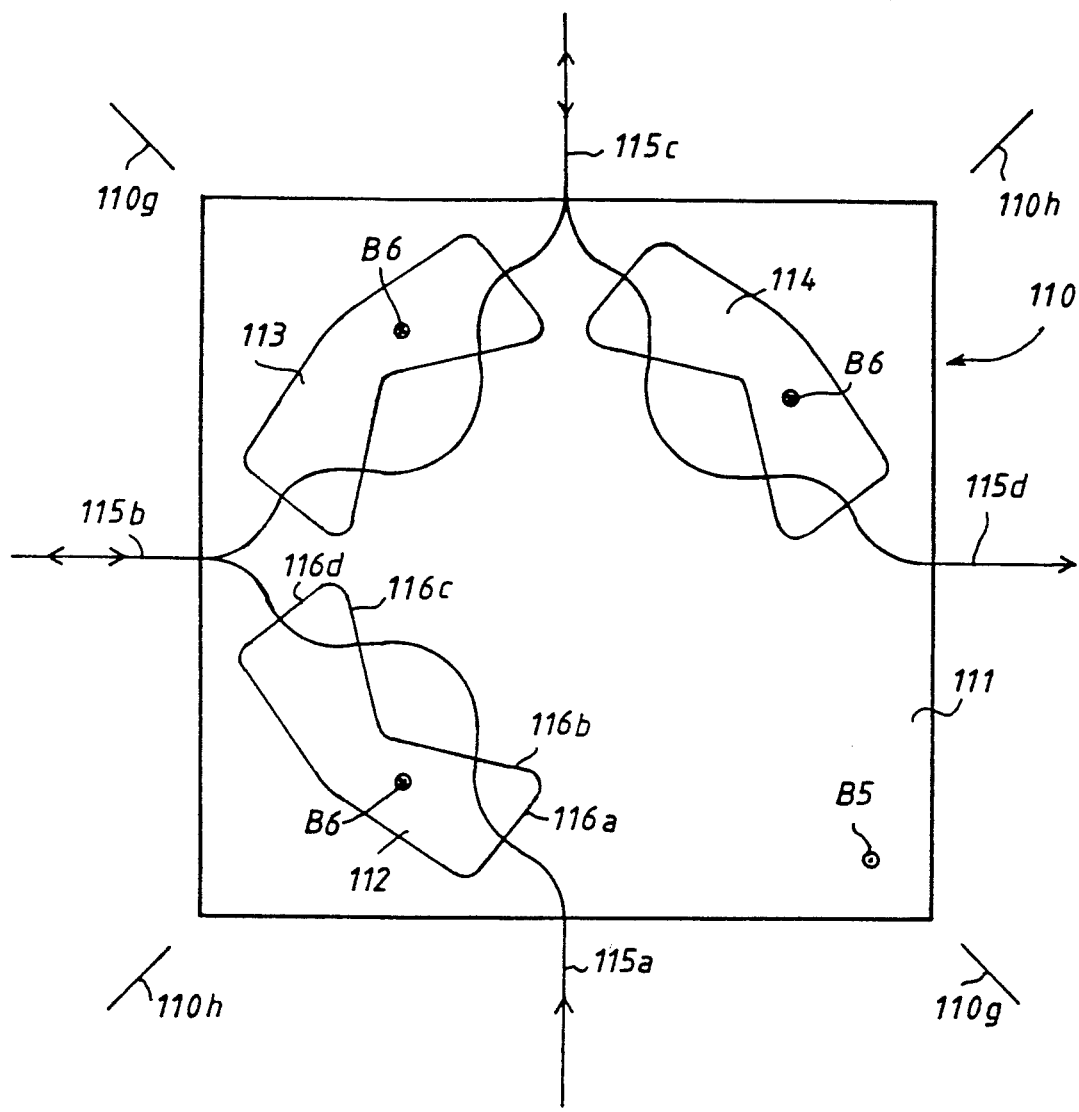

FIB. 3b is a diagram showing the axis potential and the electric field strength of the mirror lens combination of FIG. 3a;

FIG. 3c is a diagram of the fundamental beam paths in the electrostatic mirror lens arrangement of FIG. 3a for four different potential combinations;

FIG. 4 shows the schematic beam path of a second embodiment for an imaging electron microscope;

FIG. 5a shows a section view taken through a second electrostatic mirror lens combination having six electrodes;

FIG. 5b shows the schematic beam paths through the mirror lens arrangement of FIG. 5a; and, FIG. 6 shows the schematic beam path of a further embodiment of a deflector free of dispersion.

DESCRIPTION OF THE PREFERRED EMBODIMENTS OF THE INVENTION

Figure 1:
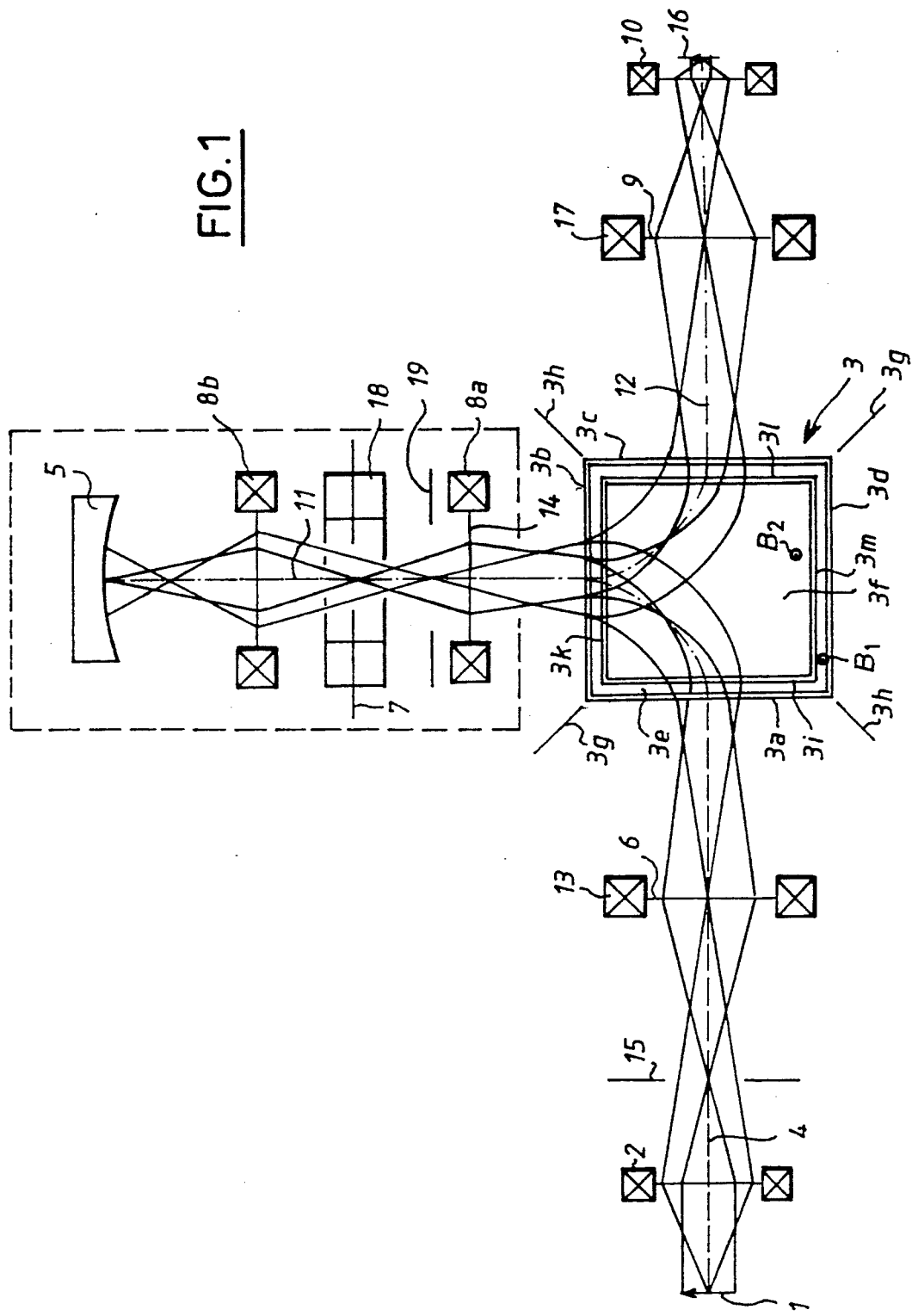
FIG. 1 is a schematic beam path of an imaging system according to the invention for a scanning electron microscope.

The scanning electron microscope of FIG. 1 comprises an electron source having a crossover plane 1 and a condenser lens 2 which images the crossover plane 1 along the optical axis 4. These electrons pass through a first entry plane 3a and enter a beam deflector 3. The beam deflector 3 has a quadratic cross section and comprises outer pole shoes 3e and inner pole shoes 3f. An outer magnetic field $B_1$ is present between the outer pole shoes 3e and an inner magnetic field $B_2$ is present between the inner pole shoes 3f. Both magnetic fields are directed perpendicularly to the plane of the drawing with the outer magnetic field $B_1$ being stronger than the inner magnetic field $B_2$. The diagonal planes (3g, 3h) are then symmetry planes of the deflector 3. The magnitudes of the two magnetic fields ($B_1$, $B_2$) are adjusted so that the deflector 3 deflects the optical axis 4 by 90° in the direction toward a mirror 5 and that the rearward intermediate image plane 6 of the condenser lens 2 is imaged stigmatically in an intermediate plane 7 between the mirror 5 and the deflector 3. In addition, a field lens 13 is arranged in the intermediate plane 6 of the condenser lens which images the rearward diffraction plane 15 of the condenser lens 2 in the diagonal plane 3g of the deflector.

A lens system (8a, 8b) images the diagonal plane 3g of the deflector 3 in the electrostatic mirror 5. The mirror 5 and the lens system (8a, 8b) coact as an autocollimation system and image the diagonal plane 3g into the diagonal plane 3h with an imaging scale of 1:1. In this way, the electron paths coming into and exiting from the mirror are symmetrical to the optical axis 11 of the mirror arm.

Since the mirror and the lens system (8a, 8b) are rotationally symmetrical, they cause no errors of the second order, and the dispersion and errors of the second order of the non-rotational symmetrical deflector 3 cancel because of the symmetry of the beam paths in the deflector 3 after a two-time passthrough.

In the exit plane 3c of the deflector, the electrons exit along an optical axis 12 which is coaxial to the optical axis 4 of the electrons entering into the deflector 3. The system, comprising the deflector 3, lens system (8a, 8b) and mirror 5, images the intermediate plane 6 of the condenser lens 2 in the intermediate plane 9 in the imaging scale of 1:1. An objective 10 images the image of the crossover plane 1 generated here on an object 16 reduced by the intermediate magnification V. A scanning system (not shown) scans the object 16. A further field lens 17 is mounted in the intermediate image plane on the objective side. The field lens 17 images the symmetry planes (3g, 3h) into the diffraction plane of the objective 10 facing away from the object 16.

The entry and exit planes (3a, 3b, 3c, 3d) of the outer magnetic field $B_1$ are planes perpendicular to the particular optical axes (4, 11, 12) so that disturbing influences of the peripheral field are avoided. The entry and exit planes (3i, 3k, 3q, 3m) of the inner deflecting field $B_2$ are parallel to the entry and exit planes (3a, 3b, 3c, 3d) of the outer field $B_1$ corresponding thereto.

By means of a suitable selection of the excitation of the lens system (8a, 8b) and the voltages of the electrostatic mirror 5, the negative chromatic error of this combination of mirror and lenses is varied over a wide range in such a manner that the positive chromatic aberration of the objective lens 10 is compensated. The remaining spherical aberration can then be simply adjusted by means of a magnetic hexapole element 18 arranged in the diffraction plane 7 between the lenses (8a, 8b) and centered to the optical axis 11. The hexapole element 18 is passed through twice and therefore acts as the hexapole doublet described in the literature referred initially. In this way, the cathode 1 is imaged without chromatic and spherical aberrations on the object 16. The system of lenses (8a, 8b) and mirror 5 can also be replaced by the electrostatic mirror lens combination of FIG. 3a or FIG. 5a.

Figure 2A:
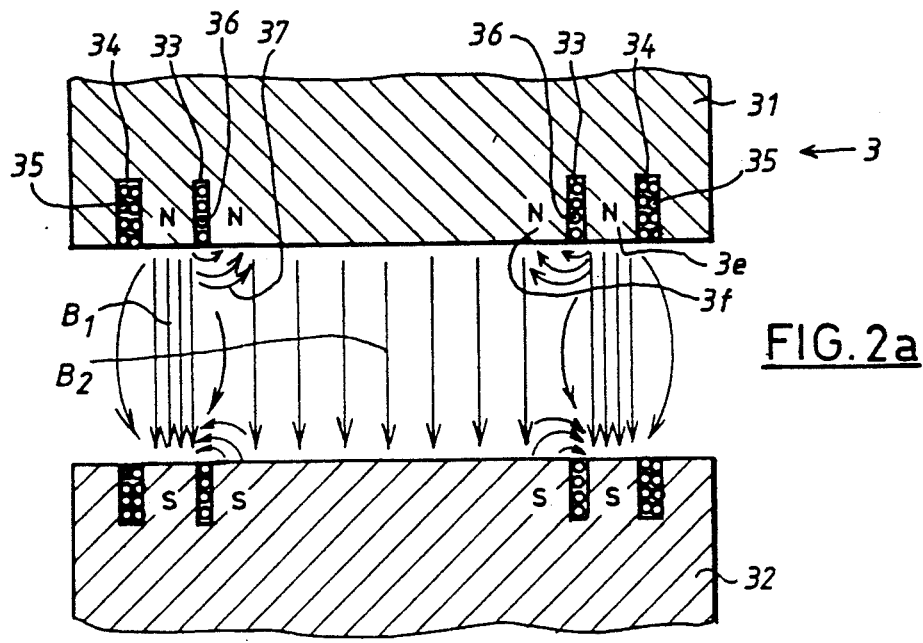
FIG. 2a is a plan view of the beam deflector of the imaging system of FIG. 1.

In FIG. 2a, the beam deflector 3 is shown in a section plane perpendicular to the plane of the drawing of FIG. 1. The beam deflector 3 comprises an upper pole shoe 31 and a lower pole shoe 32. An inner rectangularly-shaped slot 33 and an outer rectangularly-shaped slot 34 are machined into each pole shoe. The excitation coils (35, 36) of the deflector are accommodated in these two slots (33, 34) as shown. The outer coil 35 is relatively intensely excited and generates the outer magnetic deflecting field having the intensity $B_1$ in the region between the two slots (33, 34). The inner coils 36 are weaker and excited in opposition to the outer coils 35. In this way, the weaker inner magnetic deflecting field having the intensity $B_2$ occurs in an inner region within the slot 33 between the two pole shoes 31 and 32. The arrows between the two pole shoes 31 and 32 illustrate the field lines of the two magnetic deflecting fields ($B_1$, $B_2$) with the spacing of the arrows representing the field intensity.

Figure 2B:
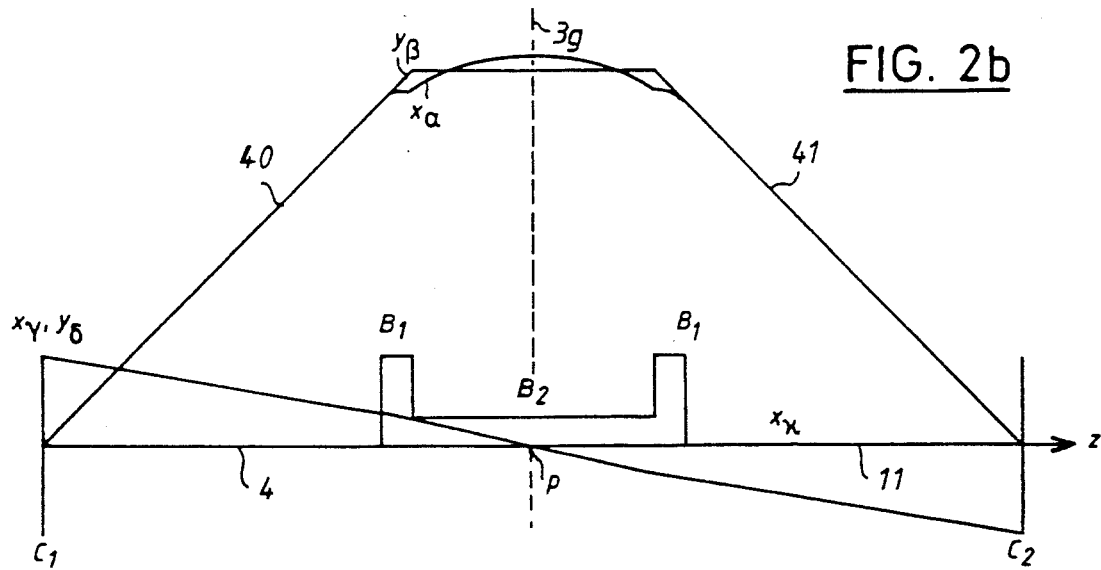

In FIG. 2b, the trace of the fundamental paths relative to the optical axis are shown, that is, the optical axes which are each deflected by 90° within the deflector shown in FIG. 1 are shown in FIG. 2b as straight lines. The intermediate planes forward and rearward of the deflector are identified by $C_1$ and $C_2$; that is, for an electron, which exits in FIG. 1 from the cathode 1, $C_1$ identifies the image plane 6 of the condenser lens and $C_2$ identifies the image plane 19 between the deflector 3 and the mirror 5. The field paths in the plane of the drawing of FIG. 1 are identified by ($x_\gamma$) and the field paths in the yz-plane perpendicular to the plane of the drawing of FIG. 1 are identified by $y_\delta$. The field paths ($x_\gamma$, $y_\delta$) intersect the optical axis (z) in the center of the deflector characterized by the two deflecting fields ($B_1$, $B_2$).

The aperture paths for an electron propagating in the plane of the drawing of FIG. 1 is identified in FIG. 2b by $x_\alpha$. An electron travelling along the $x_\alpha$-path is subjected to a force in the direction toward the optical axis 4 when entering into the outer magnetic field $B_1$ because of its velocity component disposed perpendicularly to the optical axis 14. In this way, the electron is deflected toward the optical axis 4. In the inner magnetic field $B_2$, the electron travelling along the $x_\alpha$-path is then deflected away from the optical axis. For this reason, the $x_\alpha$-path first departs from the optical axis along its further course in order to then run parallel to the optical axis in the region of the symmetry plane 3g. The $x_\alpha$-path again approaches the optical axis rearward of the symmetry plane 3g and intersects the optical axis 11 in the beam path of the mirror in the region of the intermediate plane $C_2$.

The $y_\beta$-aperture path running in a plane perpendicularly to the plane of FIG. 1 experiences an acceleration in the x-direction in the outer magnetic field $B_1$. This velocity component coacts with the stray field 37 (see FIG. 2a) to effect a refraction toward the optical axis 4 at the transition from the outer magnetic field $B_1$ to the inner magnetic field $B_2$. For this reason, the $y_\beta$-path runs parallel to the optical axis in the region of the inner magnetic field $B_2$. At the transition from the inner magnetic field $B_2$ to the outer magnetic field $B_1$, the $y_\beta$-path experience a further refraction toward the optical axis 11. It is important here that in the regions (40, 41) outside of the deflector, the $x_\alpha$-path and the $y_\beta$-path intersect the optical axes (4, 11) at the same angle in the intermediate image planes ($C_1$, $C_2$). This then means that the intermediate plane $C_1$ is stigmatically imaged in the intermediate image plane $C_2$ without distortion at a scale of 1:1.

The electrostatic mirror lens combination 60 shown in FIG. 3a can be utilized in FIG. 1 in lieu of the mirror 5 and the lenses (8a, 8b) and comprises four electrodes (61, 62, 63, 64). The optical axis (z) runs in the direction toward the beam deflector (not shown). The electrodes (61, 62, 63, 64) all lie at the electric potentials ($\Phi_1, \Phi_2, \Phi_3, \Phi_4$). The potential $\Phi_4$ of the electrode 64 facing toward the beam deflector corresponds to the kinetic energy of the incoming electrons.

In FIG. 3b, the energy 66 of an electron in the mirror lens combination 60 is shown with the electron propagating along the optical axis (z). The trace of the kinetic energy 66 is referred to an electron which has an energy of 10 keV and the electrode potentials correspond to the values given in Table 1.

In FIG. 3c, the ($x_\alpha$, $y_\beta$)-paths and the ($x_\gamma$, $y_\delta$)-paths of a 10 keV electron are shown at three different settings of the potentials ($\Phi_1, \Phi_2, \Phi_3, \Phi_4$). The solid line paths belong to the potential setting given in Table 1. For a setting of the voltages according to Table 2, the broken line paths result and for a setting according to Table 3, the dash-dot paths result. From the values for the chromatic aberration $C_c$ given in the Tables 1 to 3 it becomes evident that the negative chromatic aberration of the electrostatic mirror lens combination 60 can be adjusted over a large range by changing the potentials applied to the electrodes. The error coefficients $C_c$ of the chromatic aberration and $C_o$ of the spherical aberration relate then to the object plane for the intermediate magnification V given in the Tables.

The electrons propagating along the $\gamma$-paths and $\delta$-paths intersect the optical axis (z) for all potential settings at the same position ($z_o$) and thereafter propagate to a path mirror symmetric to the incoming path with reference to the optical axis (z). The electrons propagating along the $\alpha$-paths and $\beta$-paths are reflected into themselves at the end of the $\alpha$-paths and $\beta$-paths. The $\alpha$-paths and $\beta$-paths intersect the optical axis (z) at the position identified by ($z_1$). At this position, a virtual intermediate plane is present.

The $\gamma$-paths and $\delta$-paths intersect the optical axis at $z=180$ mm. Here, a diffraction plane is present which is coincident with the symmetry planes (3g, 3h) of the deflector for the overall system.

The imaging system in FIG. 4 has a deflector 80 free of dispersion. The deflector comprises outer pole shoes 81 and inner pole shoes 82. The magnetic field $B_4$ between the inner pole shoes 82 is twice as large in magnitude as the magnetic field $B_3$ between the outer pole shoes 81. The direction of the two magnetic fields ($B_3$, $B_4$) is perpendicular to the plane of the drawing. Between the inner and outer pole shoes, a space 83 is provided which is preferably free of a magnetic field. Here, a third magnetic deflecting field can, in principle, be interposed.

Electric fields E are superposed on the inner magnetic field $B_4$ and are directed in each case radially to the particular optical axis (85a, 85b, 85c). Electrodes (84a to 84c) are provided for generating the electric fields. The electrode surfaces facing toward the optical axes (85a to 85c) have the form of cylindrical surfaces. The voltage applied to the electrodes is so selected that the magnetic deflection of the electron paths within the inner magnetic field $B_4$ is compensated approximately to one half. In this way, the imaging provided by the deflector is already free of dispersion for a simple passthrough.

The deflector 80 is symmetrical to the diagonal plane 80g in the region of the optical axis 85a and is symmetrical to the second diagonal plane 80h in the region of the optical axes (85b and 85c).

The deflector deflects the electrons incoming along the optical axes (85a to 85c) each by 90° for each passthrough. The intermediate image plane 87 of a condenser lens (not shown) is imaged in the diagonal plane 80h at the illuminating end. A field lens 91 mounted forward of the objective 90 images the diagonal plane 80h in the rearward diffraction plane 90a of the objective 90. At the same time, the field lens 91 images the diffraction plane 90a of the objective 90 in the diagonal plane 80g. In the same manner as shown in FIG. 1, this diagonal plane 80g is imaged via the mirror 93 in the second diagonal plane 80h with an intermediate image of the diagonal planes (80g, 80h) lying in the mirror 93. A projection lens 94 generates a real image of the object 92 in the plane 95. The deflector itself images the intermediate image planes (86, 88, 89) one upon the other stigmatically and free of distortion.

A constant offset potential can be applied to the electrodes (84a to 84c) in order to adjust the refractive power of the deflector 80 in the direction perpendicular to the plane of the drawing. In this way, a quadrupole field is generated which acts to additionally focus or defocus perpendicular to the plane of the drawing in dependence upon whether a positive or negative offset potential is applied. The value of the offset potential (relative to the potential of the pole shoes (81, 82)) is so selected that the deflector 80 has the same refractive power in the plane of the drawing and in the direction perpendicular to the plane of the drawing.

The errors of the second order of the deflector 80 are cancelled after a two-time passthrough because the beam paths at the observation end run symmetrically to one of the diagonal planes (80g, 80h) in the region of the optical axes (85a, 85b). The negative chromatic aberration of the mirror 93 is then just so adjusted that the positive chromatic aberration of the objective 90 is compensated. The common spherical aberration of objective 90 and mirror 93 is compensated by a magnetic hexapole 96. The hexapole 96 is mounted for this purpose in a plane 90b conjugated to the diffraction plane 90a. The object 92 is imaged magnified in the plane 95 without chromatic and spherical aberrations.

Since each individual passthrough through the deflector 80 is free of dispersion, no combined errors occur between the dispersion and the chromatic or spherical aberrations of the mirror 93. Therefore, the imaging system is corrected also for a large image field with respect to chromatic and spherical aberrations.

It should still be noted that the diffraction plane 90a must not necessarily be imaged in the diagonal planes (80g, 80h) and in the mirror 93. Rather, it is also possible to image an intermediate image plane in the diagonal planes. A real intermediate image of the object 92 is then produced in the mirror 93. The hexapole must then be so mounted that it again lies in the diffraction plane. Because of the exchanged paths, an electrostatic hexapole is then to be used.

The system of lenses (97a, 97b and mirror 93 preferably comprises an electrostatic mirror lens system 98 which is described with reference to FIGS. 5a and 5b.

The electrostatic mirror lens system of FIG. 5a has six electrodes (101 to 106). With a suitable selection of potentials on the six electrodes, the imaging characteristics can be adjusted with respect to different spacings of the intermediate image and diffraction planes as well as with respect to the chromatic aberration and the slope of the α-path in the interior of the mirror lens combination. A magnetic hexapole 107 is mounted in the hollow space of the electrode 103 for adjusting the spherical aberration. The hexapole field acts through the wall of the electrode 103. In FIG. 5a, only half of the mirror lens combination 100 is shown for simplification. The electrodes 101 to 106 are rotationally symmetrical to the optical axis (z).

In FIG. 5b, the ($x_\alpha$, $y_\beta$)-paths and the ($x_\gamma$, $y_\delta$)-paths for the 10 keV electrons are shown at the potentials ($\Phi_1$ to $\Phi_6$) listed in the Tables 4 to 8. Electrons on the ($\alpha$, $\beta$)-paths are reflected at the location ($Z_o$) into themselves whereas electrons on the ($\gamma$, $\delta$) -paths are deflected to a ($\gamma$, $\delta$)-path mirror symmetrical to the z-axis.

As Tables 4 to 8 show, the chromatic aberration $C_c$ of the mirror lens combination can be varied over a large range. The position of the diffraction plane present at ($z_2$) can be varied by varying the potential $\Phi_5$ (which is fixed in Tables 4 to 8) and by a suitable adaptation of the potentials ($\Phi_1$ to $\Phi_4$). The magnetic hexapole for adjusting the spherical aberration is mounted in the vicinity of the diffraction plane present at ($z_3$).

The values given in the Tables 4 to 8 for the spherical aberration $C_5$ and the chromatic aberration $C_c$ refer to an object plane for intermediate magnification likewise provided in the Tables. The system comprising beam deflector and electrostatic mirror lens combination therefore permits the simultaneous correction of chromatic and spherical aberrations for different objective excitations and different intermediate magnifications resulting therefrom.

In FIG. 6, a second embodiment is shown for a deflector 110 which is free of dispersion for a one-time passthrough. The deflector has two outer quadratic pole shoes 111 between which an outer magnetic field $B_5$ perpendicular to the plane of the drawing is generated. Three additional pole shoe pairs (112, 113, 114) are mounted in the interior of the deflector. The pole shoe pairs (112 and 114) are mirror symmetrical to the first diagonal plane 110h and the pole shoe pair 113 is mirror symmetrical to the second diagonal plane 110g of the deflector. Magnetic deflecting fields $B_6$ are generated between the inner pole shoe pairs and these fields are likewise perpendicular to the plane of the drawing but are directed opposite to the outer deflecting field $B_5$. The magnitude of the inner deflecting field $B_6$ is approximately the same as the magnitude of the outer deflecting field $B_5$.

The deflector 110 deflects the electrons incoming along optical axes (115a, 115b, 115c) each by 90°. The electron then enter into the interior of the deflector and each enters and leaves the inner magnetic field twice. For this purpose, the entry and exit surfaces (116a, 116b, 116c, 116d) of the inner deflecting fields are arranged essentially in an M-shaped manner with respect to each other. The outer and inner magnetic fields ($B_5$, $B_6$) are so adjusted that the electron paths in each of the three utilized quadrants of the deflector 110 each run symmetrically to one of the diagonal planes (110g, 110h) and that, because of the opposing deflections in the inner and outer magnetic fields, each 90° deflection takes place free of dispersion. The electron paths then enter and leave the inner magnetic field $B_6$ at an angle deviating from 90°. In this way, quadrupole fields become effective which effect a focussing of the electron paths perpendicularly to the plane of the drawing.

Irrespective of the fact that only magnetic deflecting fields are necessary with this deflector and that the assembly is simplified relative to the deflector of FIG. 4, both deflectors (80, 110) have equivalent imaging characteristics. The arrangement of the deflector 110 within the electron microscope is completely analog to the deflector of FIG. 4 so that the further details with respect to the imaging of the imaging and diffraction planes in the symmetry planes (110g, 110h) are not discussed again.

It is understood that the foregoing description is that of the preferred embodiments of the invention and that various changes and modifications may be made thereto without departing from the spirit and scope of the invention as defined in the appended claims.

TABLE 1

| | | |
|---|---|---|
| $\Phi_1 =$ | $-4.243$ | kV |
| $\Phi_2 =$ | $+15.847$ | kV |
| $\Phi_3 =$ | $+3.212$ | kV |
| $\Phi_4 =$ | $+10$ | kV |
| $C_c =$ | $-10$ | mm |
| $C_{\bar{s}} =$ | $1.39$ | mm |
| $V =$ | $10$ | |

TABLE 2

| | | |
|---|---|---|
| $\Phi_1 =$ | $-2.411$ | kV |
| $\Phi_2 =$ | $+8.929$ | kV |
| $\Phi_3 =$ | $+2.351$ | kV |
| $\Phi_4 =$ | $+10$ | kV |
| $C_c =$ | $-20$ | mm |
| $C_{\bar{s}} =$ | $+2.36$ | mm |
| $V =$ | $10$ | |

TABLE 3

| | | |
|---|---|---|
| $\Phi_1 =$ | $-1.112$ | kV |
| $\Phi_2 =$ | $+4.091$ | kV |
| $\Phi_3 =$ | $+2.087$ | kV |
| $\Phi_4 =$ | $+10$ | kV |
| $C_c =$ | $-50$ | mm |
| $C_{\bar{s}} =$ | $+4.54$ | mm |
| $V =$ | $10$ | |

TABLE 4

| | | |
|---|---|---|
| $\Phi_1 =$ | $-1.382$ | kV |
| $\Phi_2 =$ | $+4.946$ | kV |
| $\Phi_3 =$ | $+0.732$ | kV |
| $\Phi_4 =$ | $+8.127$ | kV |
| $\Phi_5 =$ | $+1.553$ | kV |

TABLE 4-continued

| | | |
|---|---|---|
| $\Phi_6 =$ | $+10$ | kV |
| $C_c =$ | $-6.4$ | mm |
| $C_{\bar{s}} =$ | $-0.1$ | mm |
| $V =$ | $23.9$ | |

TABLE 5

| | | |
|---|---|---|
| $\Phi_1 =$ | $-1.856$ | kV |
| $\Phi_2 =$ | $+6.686$ | kV |
| $\Phi_3 =$ | $+0.807$ | kV |
| $\Phi_4 =$ | $+8.127$ | kV |
| $\Phi_5 =$ | $+1.553$ | kV |
| $\Phi_6 =$ | $+10$ | kV |
| $C_c =$ | $-13.5$ | mm |
| $C_{\bar{s}} =$ | $-0.9$ | mm |
| $V =$ | $13.3$ | |

TABLE 6

| | | |
|---|---|---|
| $\Phi_1 =$ | $-3.124$ | kV |
| $\Phi_2 =$ | $+11.316$ | kV |
| $\Phi_3 =$ | $+1.132$ | kV |
| $\Phi_4 =$ | $+8.127$ | kV |
| $\Phi_5 =$ | $+1.553$ | kV |
| $\Phi_6 =$ | $+10$ | kV |
| $C_c =$ | $-50$ | mm |
| $C_{\bar{s}} =$ | $-30.8$ | mm |
| $V =$ | $4.6$ | |

TABLE 7

| | | |
|---|---|---|
| $\Phi_1 =$ | $-5.716$ | kV |
| $\Phi_2 =$ | $+22.236$ | kV |
| $\Phi_3 =$ | $+2.104$ | kV |
| $\Phi_4 =$ | $+8.126$ | kV |
| $\Phi_5 =$ | $+1.553$ | kV |
| $\Phi_6 =$ | $+10$ | kV |
| $C_c =$ | $-2$ | mm |
| $C_{\bar{s}} =$ | $-0.2$ | mm |
| $V =$ | $13.3$ | |

TABLE 8

| | | |
|---|---|---|
| $\Phi_1 =$ | $-0.708$ | kV |
| $\Phi_2 =$ | $+2.505$ | kV |
| $\Phi_3 =$ | $+0.732$ | kV |
| $\Phi_4 =$ | $+8.127$ | kV |
| $\Phi_5 =$ | $+1.553$ | kV |
| $\Phi_6 =$ | $+10$ | kV |
| $C_c =$ | $-50$ | mm |
| $C_{\bar{s}} =$ | $-2.4$ | mm |
| $V =$ | $13.3$ | |

What is claimed is:

1. A imaging system for guiding a beam of charged particles along an optical axis in particle beam apparatus, the imaging system comprising:
   a deflector mounted on said optical axis;
   said deflector having a first region wherein said deflector is symmetrical to a first symmetry plane and having a second region wherein said deflector is symmetrical to a second symmetry plane;
   electrostatic mirror means mounted downstream of said deflector so as to be conjugated to said symmetry planes;
   a lens system interposed between said electrostatic mirror means and said deflector for imaging said symmetry planes in said electrostatic mirror means; and,
   said electrostatic mirror means and said lens system conjointly defining means for imaging said symmetry planes one atop the other in the imaging scale of 1:1.

2. The imaging of claim 1, said electrostatic mirror comprising an electrostatic mirror-lens combination.

3. The imaging system of claim 2, said deflector being adapted to deflect the particle beam at the same angle of magnitude with each passthrough therethrough.

4. The imaging system of claim 3, said electrostatic mirror lens combination defining an optical axis; and, said symmetry planes intersecting said optical axis of said electrostatic mirror-lens combination.

5. The imaging system of claim 4, wherein said angle is 90°.

6. The imaging system of claim 1, said deflector having first induction means for generating an outer magnetic deflection field and second induction mean for generating at least one additional magnetic deflection field.

7. The imaging system of claim 6, wherein the apparatus includes an electron source and wherein the optical axis extends between said electron source and an object and has a first optical axis segment between the electron source and said deflector, a second optical axis segment between said electrostatic mirror means and said deflector and a third optical axis segment between said deflector and the object; and, said outer magnetic field having entry and exit planes which are respective planes perpendicular to said first, second and third optical axis segments.

8. The imaging system of claim 7, further comprising an objective arranged on said third optical axis segment and defining a diffraction plane and intermediate image planes; and, said symmetry planes being planes conjugated to said diffraction plane or to said intermediate image planes.

9. The imaging system of claim 8, said outer and said additional magnetic deflection fields being in the same direction and said additional magnetic field being the only additional magnetic field; and, said symmetry planes being conjugated to said diffraction plane.

10. The imaging system of claim 8, said deflector having first induction means for generating a first magnetic field and second induction means for generating a second magnetic field; and, said deflector further having field generating means for generating electrostatic deflection fields.

11. The imaging system of claim 8, said deflector including: outer induction means for generating an outer magnetic field; first, second and third induction means for generating first, second and third inner magnetic fields; and, said first, second and third inner magnetic fields having the same magnitude and direction.

12. The imaging system of claim 11, said inner magnetic fields having entry and exit planes arranged in an M-configuration to cause the particle beam to pass twice into and out of said inner magnetic fields.

13. The imaging system of claim 1, wherein the apparatus includes an electron source and said imaging system further comprising an objective arranged on said optical axis between said electron source and said deflector and having a diffraction plane; and, a hexapole element arranged in a plane conjugated to said diffraction plane.

14. The imaging system of claim 2, said electrostatic mirror-lens combination comprising at least four electrodes.

15. The imaging system of claim 1, said deflector comprising means for separating illuminating and viewing beam paths.

16. The imaging system of claim 1, said electrostatic mirror means being an electrostatic mirror and said system further comprising a magnetic lens system arranged between said electrostatic mirror and said deflector.

17. The imaging system of claim 16, said deflector being adapted to deflect the particle beam at the same angle of magnitude with each passthrough therethrough.

18. The imaging system of claim 17, said magnetic lens system defining an optical axis; and, said symmetry planes intersecting said optical axis of said magnetic lens system at half the deflection angle.

19. The imaging system of claim 18, wherein said angle is 90°.

20. An imaging system for guiding a beam of charged particles along an optical axis in particle beam apparatus, the imaging system comprising:

a deflector mounted on said optical axis;

said deflector having a first region wherein said deflector is symmetrical to a first symmetry plane and having a second region wherein said deflector is symmetrical to a second symmetry plane;

electrostatic mirror means mounted downstream of said deflector so as to be conjugated to said symmetry planes;

a lens system interposed between said electrostatic mirror means and said deflector for imaging said symmetry planes in said electrostatic mirror means;

said electrostatic mirror means and said lens system conjointly defining means for imaging said symmetry planes one atop the other in the imaging scale of 1:1;

an electron source;

said optical axis extending between said electron source and an object and has a first optical axis segment between the electron source and said deflector, a second optical axis segment between said electrostatic mirror means and said deflector and a third optical axis segment between said deflector and the object;

an objective arranged on said third optical axis segment and defining a diffraction plane; and, said symmetry planes being planes conjugated to said diffraction plane.

21. An imaging system for guiding a beam of charged particles along an optical axis in particle beam apparatus, the imaging system comprising:

a deflector mounted on said optical axis;

said deflector having a first region wherein said deflector is symmetrical to a first symmetry plane and having a second region wherein said deflector is symmetrical to a second symmetry plane;

electrostatic mirror means mounted downstream of said deflector so as to be conjugated to said symmetry planes;

a lens system interposed between said electrostatic mirror means and said deflector for imaging said symmetry planes in said electrostatic mirror means;

said electrostatic mirror means and said lens system conjointly defining means for imaging said symmetry planes one atop the other int he imaging scale of 1:1;

said deflector having first induction means for generating an outer magnetic deflection field and second induction means for generating an inner magnetic deflection field; and, said magnetic deflection fields conjointly defining particle beam paths through said deflector; and, said deflector further including electric field generating means for generating a plurality of electric fields superposed on said inner magnetic deflection field to compensate the magnetic deflection of said particle beam paths thereby rendering imaging by said deflector free of dispersion for a simple pass of the particle beam through said deflector.

22. The imaging system of claim 21, said inner magnetic fields having entry and exit planes arranged in an M-configuration to cause the particle beam to pass twice into and out of said inner magnetic fields.

23. An imaging system for guiding a beam of charged particles along an optical axis in particle beam apparatus, the imaging system comprising:

a deflector mounted on said optical axis;

said deflector having a first region wherein said deflector is symmetrical to a first symmetry plane and having a second region wherein said deflector is symmetrical to a second symmetry plane;

electrostatic mirror means mounted downstream of said deflector so as to be conjugated to said symmetry planes;

a lens system interposed between said electrostatic mirror means and said deflector for imaging said symmetry planes in said electrostatic mirror means;

said electrostatic mirror means and said lens system conjointly defining means for imaging said symmetry planes one atop the other int he imaging scale of 1:1;

said deflector having first induction means for generating an outer magnetic deflection field and second induction means for generating a plurality of inner magnetic deflection fields all identical in magnitude and direction and opposed to said outer magnetic deflection field; and, said magnetic deflection fields conjointly defining particle beam paths through said deflector so as to render imaging by said deflector free of dispersion for a simple pass of the particle beam through said deflector.

24. The imaging system of claim 23, said inner magnetic fields having entry and exit planes arranged in an M-configuration to cause the particle beam to pass twice into and out of said inner magnetic fields.

25. The imaging system of claims 23, said outer magnetic deflection field being a single outer magnetic deflection field and said plurality of inner magnetic deflection fields being three inner magnetic deflection fields.

* * * * *

UNITED STATES PATENT AND TRADEMARK OFFICE
CERTIFICATE OF CORRECTION

PATENT NO. : 5,319,207                                        Page 1 of 2

DATED      : June 7, 1994

INVENTOR(S) : Harald Rose, Ralf Degenhardt and Dirk Preikszas

It is certified that error appears in the above-identified patent and that said Letters Patent is hereby corrected as shown below:

In the title page, under "Other Publications", line 9: delete "microanalyseuur" and substitute -- microanalyseur -- therefor.

In column 6, line 14: delete "experience" and substitute -- experiences -- therefor.

Column 6, line 49, delete "$C_o$" and substitute -- $C_{\ddot{o}}$ -- therefor.

In column 8, line 14: between "97b" and "and", insert -- ) --.

In column 9, line 5: delete "electron" and substitute -- electrons -- therefor.

In column 11, line 1: between "imaging" and "of", insert -- system --.

UNITED STATES PATENT AND TRADEMARK OFFICE
CERTIFICATE OF CORRECTION

PATENT NO. : 5,319,207

DATED : June 7, 1994

INVENTOR(S) : Harald Rose, Ralf Degenhardt and Dirk Preikszas

It is certified that error appears in the above-identified patent and that said Letters Patent is hereby corrected as shown below:

In column 11, line 14: delete "mean" and substitute -- means -- therefor.

In column 12, line 63: delete "int he" and substitute -- in the -- therefor.

In column 14, line 6: delete "int he" and substitute -- in the -- therefor.

Signed and Sealed this

Sixth Day of September, 1994

Attest:

BRUCE LEHMAN

Attesting Officer

Commissioner of Patents and Trademarks